US006914766B2

(12) United States Patent
Gonella et al.

(10) Patent No.: US 6,914,766 B2
(45) Date of Patent: *Jul. 5, 2005

(54) VARIABLE CAPACITOR, FILTER AND NMR SENSOR COMPRISING SUCH A CAPACITOR

(75) Inventors: Olivier Gonella, Bischwiller (FR); Jean-Max Tyburn, Wissembourg (FR); Christian Brevard, Wissembourg (FR)

(73) Assignee: Bruker Biospin S.A., Wissembourg (FR)

( * ) Notice: Subject to any disclaimer, the term of this patent is extended or adjusted under 35 U.S.C. 154(b) by 189 days.

This patent is subject to a terminal disclaimer.

(21) Appl. No.: 10/347,580

(22) Filed: Jan. 22, 2003

(65) Prior Publication Data

US 2003/0137300 A1 Jul. 24, 2003

(30) Foreign Application Priority Data

Jan. 22, 2002 (FR) .............................. 02 00770

(51) Int. Cl.⁷ ............................................. H01G 5/12
(52) U.S. Cl. ...................................... 361/294; 361/295
(58) Field of Search ................................. 361/294, 295

(56) References Cited

U.S. PATENT DOCUMENTS 3,560,811 A * 2/1971 Farago ...................... 361/294
4,389,762 A * 6/1983 Reeves ...................... 29/25.42

FOREIGN PATENT DOCUMENTS

FR 2 515 861 5/1983

* cited by examiner

Primary Examiner—Douglas A. Wille
(74) Attorney, Agent, or Firm—Young & Thompson

(57) ABSTRACT

A variable capacitor includes a first component made of conductive material in the form of an at least partially hollow rod, comprising a hole or perforation extending axially into the body of the first component to form a tube portion, and a second component also made of conductive material in the form of a rod able to be fitted to a variable depth into the axial hole, the engagement depth of the second component in the first component determining the degree of capacitive coupling between them and therefore the value of the resulting capacitor. The capacitor tube portion is provided on its internal face, preferably substantially over the whole depth of the axial hole, with a layer of dielectric material, the latter extending in a continuous manner over the edge defining the access aperture of the hole and onto an adjacent part of the external face of the tube portion.

13 Claims, 1 Drawing Sheet

Figure 1:
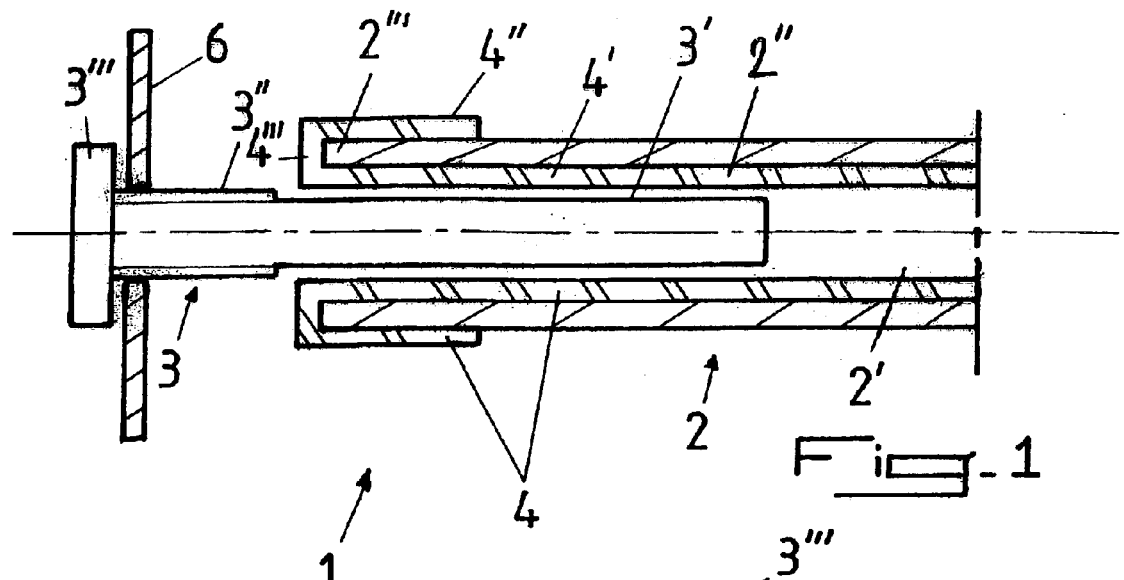
Figure 2A:
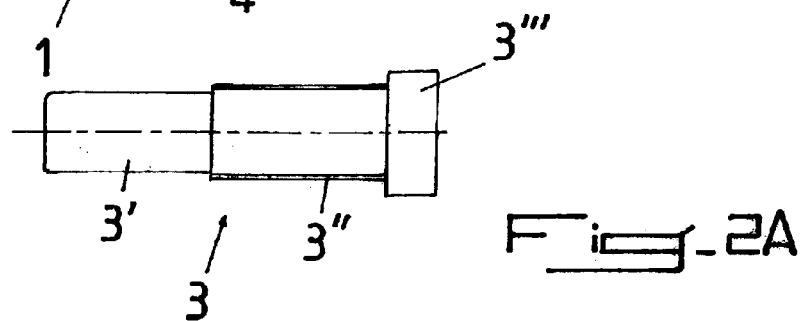
Figure 2B:
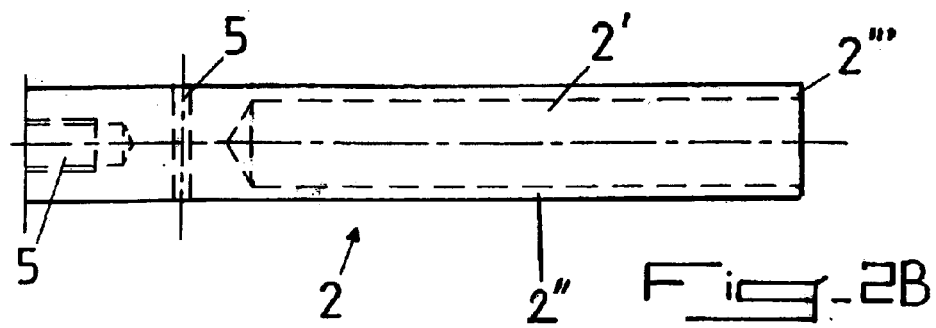
Figure 2C:
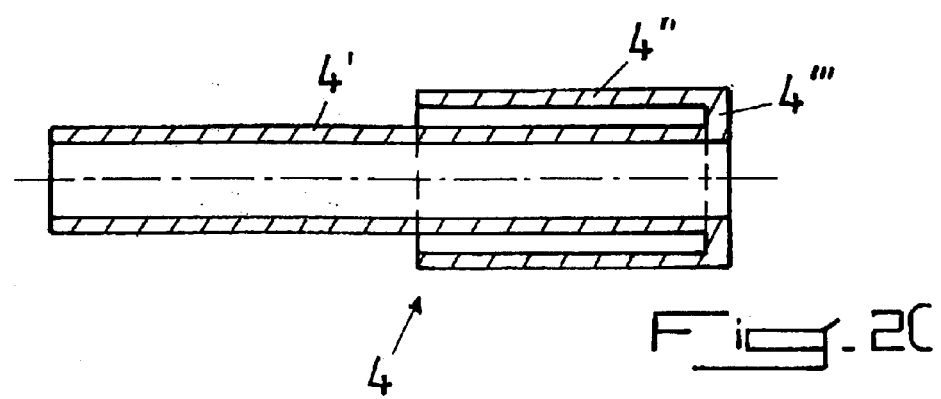

VARIABLE CAPACITOR, FILTER AND NMR SENSOR COMPRISING SUCH A CAPACITOR

The present invention concerns the field of passive electrical components, more particularly components with capacitive properties and it relates to a variable capacitor as well as a high-frequency filter and an NMR sensor comprising at least one such capacitor.

In certain applications, in particular in connection with nuclear magnetic resonance (NMR), it is necessary to have components suitable for high frequencies and able to withstand high power. It is of course advantageous that such components should be easily adjustable and easy and cheap to manufacture and demonstrate good resistance to ageing.

Thus with regard to variable capacitors, a variable capacitor structure has been proposed comprising substantially, on the one hand, a first component made of conductive material in the form of an at least partially hollow rod or bar, comprising a hole or perforation extending axially into the body of said first component to form a tube portion and, on the other hand, a second component also made of conductive material in the form of a rod able to be fitted to a variable depth into said axial hole, the engagement depth of the second component in the first component determining the degree of capacitive coupling between them and therefore the value of the resulting capacitance.

These capacitors are used in particular to produce high frequency filters.

Although such a capacitor construction may withstand large dynamic currents, its voltage resistance is not sufficient in certain applications or does not provide a sufficient safety guarantee against arcing risks in the event of excess voltage.

The object of the present invention is, in particular, to improve the variable capacitors of the aforementioned type and to compensate for the above-mentioned drawbacks.

To this end the invention proposes a variable or adjustable capacitor of the aforementioned type, characterised in that the tube portion is provided on its internal face, preferably substantially over the whole depth of the axial hole, with a layer of dielectric material, the latter preferably extending in a continuous manner over the edge defining the access aperture of said hole and onto an adjacent part of the external face of said tube portion.

The invention will be understood by means of the following description which relates to a preferred embodiment given as a non-limiting example and explained with reference to the accompanying diagrammatic drawings, in which:

FIG. 1 is a partial sectional view of a variable capacitor according to the invention, and FIGS. 2A, 2B and 2C are a side elevation (FIGS. 2A and 2B) or a longitudinal section (FIG. 2C) of the constituent components of a variable capacitor according to a preferred variation of the invention.

As the figures of the accompanying drawings show, the capacitor 1 substantially comprises, on the one hand, a first component 2 made of conductive material in the form of an at least partially hollow rod or bar, comprising a hole or perforation 2' extending axially in the body of said first component 2 to form a tube portion 2" and, on the other hand, a second component 3, also made of conductive material in the form of a rod able to be fitted to a variable depth into said axial hole 2', the engagement depth of the second component 3 in the first component 2 determining the degree of capacitive coupling between them and therefore the value of the resulting capacitance.

According to the invention, the tube portion 2" of the first constituent component 2 is provided on its internal face, preferably substantially over the whole depth of the axial hole 2', with a layer 4 of dielectric material, the latter extending in a continuous manner over the edge 2'" defining the access aperture of said hole 2' and onto an adjacent part of the external face of said tube portion 2".

Apart from compensating for the aforementioned disadvantages, this make-up of the capacitor 1 also allows good preliminary simulation of arcing faults in connection with the relative position of the components.

In order to obtain electrical characteristics which gradually develop during a relative axial sliding movement between the two components 2 and 3, in addition to easy displacement and precise guidance of the second component 3 in the first component 2, said second component 3 slides in the first component 2 with sliding contact, these components 2 and 3 both advantageously having a circular section, at least for their respective opposing surfaces.

According to a preferred embodiment of the invention, the layer 4 of dielectric material consists of polytetrafluoroethylene (TEFLON—registered trademark) and has a substantially constant thickness.

The inventors have found that excellent protection against electric arcs was obtained when the length of the axial extension I of the layer portion 4" attached to the external face of the first component 2 was greater than 10%, advantageously between 15% and 60% and preferably between 35% and 55% (best compromise for cost/performance) of the the length of the axial extension L of the layer portion 4' attached to the internal face of the tube portion 2" defining the axial hole 2'.

Thus said axial length I could be approximately 20 mm for an axial length L of 45 mm and an internal diameter of the first component 2 of approximately 5 mm.

As a variation, the external layer portion 4" could also cover the whole of the external face of the first component 2.

The layer of dielectric material could for example be attached by being deposited onto the relevant faces of the tube portion 2".

Nevertheless, in accordance with an advantageous variation of the invention, shown in FIGS. 2A, 2B and 2C of the accompanying drawings, the layer of dielectric material is formed by a component or a body, preferably in one piece, attached by fitting onto the first component 2, said body 4 being formed by a first sleeve 4' of smaller diameter and longer length, by a second sleeve 4" of larger diameter and smaller length disposed around said first sleeve 4' and by a junction ring 4'" connecting the two sleeves 4' and 4" in the region of one of their respective terminal edges.

As shown in particular in FIG. 2B in the accompanying drawings, the axial hole 2' is a blind hole and the first component 2 has at least one other threaded or non-threaded perforation 5, with an axial or transverse extension, designed to mount or fix it.

If necessary, said first component 2 could comprise a second axial hole 5, opposite the first axial hole 2' and provided with an internal screw thread to fix and to adjust it in position on an appropriate support.

Preferably and as shown in FIG. 2A of the accompanying drawings, the second component 3 consists of a screw having, on the side at the opposite end to the head 3'", a non-threaded part 3' designed to be engaged, preferably in a close-fitting manner, in the axial hole 2' of the first component 2 (the component 3 thus forming a plunger screw).

As FIG. 1 of the accompanying drawings partially shows, the first and second components 2 and 3 are mounted on a support body 6 (shown in part), the second component 3 in the form of a screw being secured in the region of its threaded part 3 adjoining its head 3''' with a sliding facility relative to the first component 2 by rotating around its longitudinal axis.

In order to achieve the possibility of optimal adjustment of the variable capacitor 1, the threaded parts 3'' and non-threaded parts 3' of the screw 3 can have substantially identical axial lengths.

The present invention also relates to a high-frequency filter, in particular of the band-pass type, characterised in that it comprises at least one variable or adjustable capacitor 1 of the type described above (not shown).

Finally the present invention also relates to an NMR power sensor, characterised in that it comprises at least one variable or adjustable capacitor 1 of the type previously described.

Of course, the invention is not limited to the embodiment described and shown in the accompanying drawings. Modifications are possible, particularly from the point of view of the constitution of the various components or by the substitution of technical equivalents, without however departing from the scope of protection of the invention.

What is claimed is:

1. Variable or adjustable capacitor, in particular for high-frequency power filters, substantially comprising on the one hand a first component made of conductive material in the form of an at least partially hollow rod or bar, comprising a hole or perforation extending axially into the body of said first component to form a tube portion and on the other hand, a second component also made of conductive material in the form of a rod able to be fitted to a variable depth into said axial hole, the engagement depth of the second component in the first component determining the degree of capacitive coupling between them and therefore the value of the resulting capacitance, characterised in that the tube portion (2'') is provided on its internal face, preferably substantially over the whole depth of the axial hole (2'), with a layer (4) of dielectric material, the latter preferably extending in a continuous manner over the edge (2''') defining the access aperture of said hole (2') and onto an adjacent part of the external face of said tube portion (2'').

2. Variable capacitor according to claim 1, characterised in that the second component (3) slides in the first component (2) with sliding contact, these components (2 and 3) both having a circular section.

3. Variable capacitor according to claim 1, characterised in that the layer (4) of dielectric material consists of polytetrafluoroethylene and has a substantially constant thickness and in that the length of the axial extension (1) of the layer portion (4'') attached to the external face of the first component (2) is greater than 10%, advantageously between 15% and 60% and preferably between 35% and 55%, of the length of the axial extension (L) of the layer portion (4') attached to the internal face of the tube portion (2'') defining the axial hole (2').

4. Variable capacitor according to claim 1, characterised in that the layer (4) of dielectric material is formed by a component or a body, preferably in one piece, attached by fitting onto the first component (2), said body (4) being formed by a first sleeve (4') of smaller diameter and longer length, by a second sleeve (4'') of larger diameter and smaller length disposed around said first sleeve (4') and by a junction ring (4''') connecting the two sleeves (4' and 4'') in the region of one of their terminal edges.

5. Variable capacitor according to claim 1, characterised in that the axial hole (2') is a blind hole and that the first component (2) has at least one other threaded or non-threaded perforation (5), with an axial or transverse extension, designed to mount or fix it.

6. Variable capacitor according to claim 5, characterised in that the second component (3) consists of a screw having, on the side at the opposite end to the head (3''') a non-threaded part (3') designed to be engaged, preferably in a close-fitting manner, into the axial hole (2') of the first component (2).

7. Variable capacitor according to claim 6, characterised in that the first and second components (2 and 3) are mounted on a support body (6), the second component (3) in the form of a screw being secured in the region of its threaded part (3) adjoining its head (3''') with a sliding facility relative to the first component (2) by rotating around its longitudinal axis.

8. Variable capacitor according to claim 6, characterised in that the threaded parts (3'') and non-threaded parts (3') of the screw (3) have substantially identical axial lengths.

9. High-frequency filter, in particular of the band-pass type, characterised in that it comprises at least one variable or adjustable capacitor (1) according to claim 1.

10. NMR power sensor, characterised in that it comprises at least one variable or adjustable capacitor (1) according to claim 1.

11. Variable capacitor according to claim 2, characterised in that the layer (4) of dielectric material consists of polytetrafluoroethylene and has a substantially constant thickness and in that the length of the axial extension (1) of the layer portion (4'') attached to the external face of the first component (2) is greater than 10%, advantageously between 15% and 60% and preferably between 35% and 55%, of the length of the axial extension (L) of the layer portion (4') attached to the internal face of the tube portion (2'') defining the axial hole (2').

12. Variable capacitor according to claim 1, characterised in that the second component (3) consists of a screw having, on the side at the opposite end to the head (3''') a non-threaded part (3') designed to be engaged, preferably in a close-fitting manner, into the axial hole (2') of the first component (2).

13. Variable capacitor according to claim 7, characterised in that the threaded parts (3'') and non-threaded parts (3') of the screw (3) have substantially identical axial lengths.

* * * * *